US006866985B2

(12) United States Patent
Lorig et al.

(10) Patent No.: US 6,866,985 B2
(45) Date of Patent: Mar. 15, 2005

(54) METHOD FOR PRODUCING A PRINTING PLATE, IN PARTICULAR FOR LETTERPRESS PRINTING AND A PRINTING PLATE FOR LETTERPRESS PRINTING

(75) Inventors: Heinz W. Lorig, Legden (DE); Stephan Lorig, Legden (DE)

(73) Assignee: Polywest Kunststofftechnik Saueressig & Partner GmbH & Co. KG (DE)

( * ) Notice: Subject to any disclaimer, the term of this patent is extended or adjusted under 35 U.S.C. 154(b) by 22 days.

(21) Appl. No.: 10/276,536

(22) PCT Filed: May 10, 2001

(86) PCT No.: PCT/EP01/05324

§ 371 (c)(1), (2), (4) Date: Nov. 13, 2002

(87) PCT Pub. No.: WO01/87600

PCT Pub. Date: Nov. 22, 2001

(65) Prior Publication Data

US 2003/0152869 A1 Aug. 14, 2003

(51) Int. Cl.[7] .................................................. G03F 7/09

(52) U.S. Cl. ....................... 430/306; 430/309; 430/494; 430/495; 101/130; 101/132; 101/133; 101/141; 101/382.1; 101/383; 101/389.1; 101/456; 101/463.1

(58) Field of Search ........................... 430/270.1, 271.1, 430/286.1, 306, 309, 494, 945; 101/130, 132, 133, 141, 382.1, 383, 389.1, 456, 463.1

(56) References Cited

U.S. PATENT DOCUMENTS

| | | | | |
|---|---|---|---|---|
| 6,112,663 A | * | 9/2000 | Ulrich et al. | 101/389.1 |
| 6,143,386 A | * | 11/2000 | Lorig et al. | 428/36.91 |
| 6,616,874 B1 | * | 9/2003 | Lazar | 264/71 |

FOREIGN PATENT DOCUMENTS

| | | | | |
|---|---|---|---|---|
| DE | 196 25 749 A1 | 1/1998 | | |
| DE | 197 56 327 A1 | 7/1999 | | |
| EP | 0 564 917 A2 | 3/1993 | | |
| EP | 671 253 A2 | * | 9/1995 | B29C/70/70 |
| WO | WO 97/49535 | * | 12/1997 | B29D/23/00 |
| WO | WO 99/32275 | * | 7/1999 | B29D/31/00 |

OTHER PUBLICATIONS

WO 97/49535 English Translation.*

International Search Report, dated Nov. 9, 2001.

International Preliminary Examination Report, dated Mar. 20, 2002.

* cited by examiner

*Primary Examiner*—Barbara L. Gilliam

(74) *Attorney, Agent, or Firm*—Fay, Sharpe, Fagan, Minnich & McKee, LLP

(57) ABSTRACT

With the method according to the invention for producing a printing plate, in particular for flexoprinting, a layer of a curable elastomer is applied to a carrier (15) with a cylindrical surface area (26), subsequently the elastomer layer is cured to an essentially cylindrical endless printing form blank and possibly ground to a cylindrical peripheral form or processed otherwise, and afterwards the printing form blank (33) is separated along a line which is essentially parallel to the axial direction of the carrier and the printing plate produced in such a manner.

17 Claims, 3 Drawing Sheets

Figure 1:
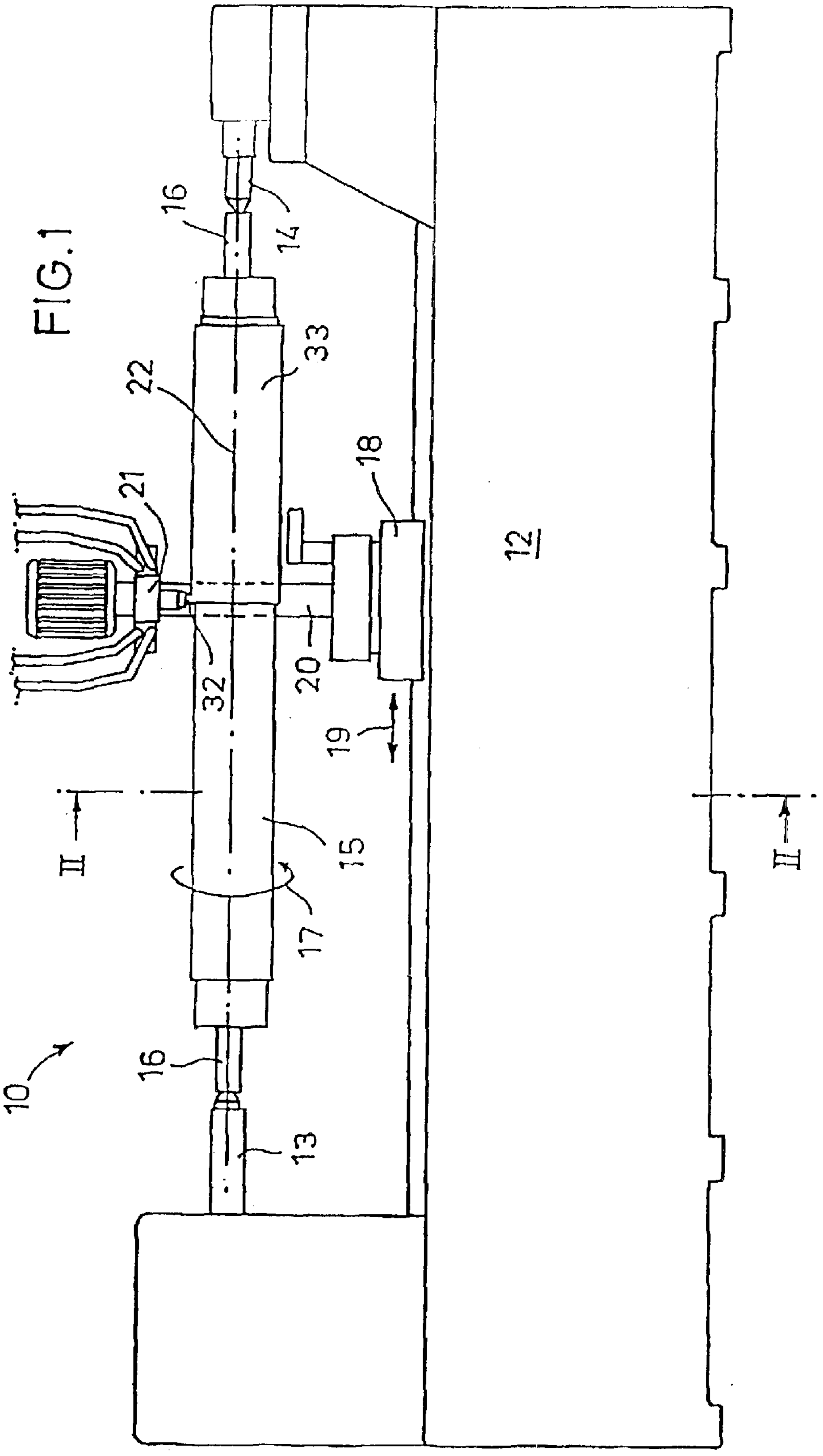

METHOD FOR PRODUCING A PRINTING PLATE, IN PARTICULAR FOR LETTERPRESS PRINTING AND A PRINTING PLATE FOR LETTERPRESS PRINTING

The invention relates to a method for producing a printing plate, in particular for relief printing and it is furthermore directed to a printing plate for relief printing, in particular for flexoprinting which is provided with a lower carrier foil or plate and an elastomer layer applied thereto.

For relief printing, in particular for flexoprinting, endless printing plates are often used, in which a seamless elastomer layer is arranged on a cylindrical carrier and is engraved at its surface so as to transfer the color at the chosen locations.

A particularly advantageous endless printing form or a method for its production is known from DE 196 25 749 C2, which is referred to expressly and the disclosure contents of which is the disclosure contents of the present invention. With the known seamless printing form, the elastomer layer is formed by a cold curing silicone polymer or silicone fluorine polymer which is applied to the cylindrical surface area of a carrier by means of a rotary casting method and which can be engraved directly by a work laser in a particularly advantageous manner after curing.

Besides endless printing plates, plate printing forms are also used for flexoprinting, for which are available rubber printing plates on the one hand and photopolymer printing plates on the other hand, which are nowadays often prepared with the "computer to plate" method for high quality flexoprinting. Hereby, the surface of a photopolymer plate, which can be cured by exposure to ultraviolet light, is initially coated with a black photoresist layer which is subsequently opened partially by a laser which is controlled by a computer transferring the image data. The regions of the polymeric plate opened in this manner are cured by the exposure, and subsequently the black layer and the underlying regions of the printing plate which are not cured are washed off so as to produce the printing plate. The method for the production of photopolymer printing plates is known per se and does not have to be explained in detail.

For printing with plate printing forms, these are mounted onto printing plate sleeves or format cylinders, for which are used corresponding adhesive tapes or foils,—so-called "tapes"—whereby differently compressible adhesive tapes are available for different printing regions or printing qualities. Particularly with very thin printing plates, it is necessary to arrange a compressible intermediate layer between the cylindrical carrier and the printing plate, as otherwise a clean print image will not be achieved due to the small inherent flexibility of a thin printing plate. Besides the securing of the printing plates on the carrier with the help of adhesive tapes or foils, it is also possible to arrange the material of the photopolymer plate on a ferromagnetic foil or plate, for example on a tin foil which can then be adhesively secured to magnetic cylinders.

The known photopolymer plates, plates with one layer, plates with multiple layers or plates produced from liquid polymers, have the disadvantage that their surface only obtains the final hardness necessary for printing only after exposure of the plate and can therefore vary their surface quality before exposure which leads to unevenness in the plate surface which diminishes the printing quality. A mechanical finishing of the photopolymer plates for smoothing their surface after exposure is also not possible as the projecting printing parts of the plate would again be damaged thereby.

It is the object of the invention to give a method for producing a printing plate with which it is possible to produce a printing plate for relief printing which can be processed at its surface in an accurate mechanical manner before printing data are transferred to the plate. The method is supposed to be particularly suitable for the production of thin printing plates and for printing plates having a ferromagnetic metal substructure which can be used on magnetic cylinders.

This object is solved by means of the invention by a method which is characterized by the following method steps:

a) applying a layer of a curable elastomer to a carrier having a cylindrical surface area;

b) curing the elastomer layer on the carrier into an essentially cylindrical, endless printing form blank;

c) separating the printing form blank along a section line essentially parallel to the axial direction of the carrier; and d) withdrawal of the printing plate, which is produced in such a manner, from the surface area of the carrier.

According to the method of the invention, similar to the printing form according to DE 196 25 749, an endless printing form is produced initially by applying a curing elastomer to a cylinder or a cylindrical hollow sleeve with a cylindrical surface area, which is cut open from one end of the cylinder to the other after the curing of the elastomer layer and which forms the printing plate. Preferably, a silicone polymer, a silicone fluorine polymer or a polyurethane polymer can be used as the curing elastomer. The use of a cold curing silicone polymer or silicone fluorine polymer is particularly advantageous, as is suggested by the older patent specification DE 196 25 749. Same as there, the curing elastomer is conveniently applied to the surface area of the carrier by means of a rotary casting method, preferably as a track-like material strand describing a helical line.

Preferably, a separating layer is applied to the cylindrical surface area of the carrier prior to the application of the elastomer, which guarantees the easy withdrawal of the printing form blank from the surface area of the carrier after the curing and the separation thereof. The separating layer can thereby consist of an elastic foil or plate which is placed around the surface area of the carrier. The arrangement is preferably made in such a manner that the foil or plate is placed around the carrier while forming a seam line, and that the subsequent cutting line runs along the seam line, so that only the elastomer which is cured as the printing form blank has to be separated so as to be able to lift the printing plate from the cylindrical carrier.

It is particularly advantageous if the carrier consists essentially of a vacuum cylinder and the foil or plate is held to the cylindrical surface area by means of a vacuum, whereby it is ensured that it does not adhere closely to the cylinder surface and that, after the withdrawal of the printing plate from the carrier, it does not comprises any unevenness. The foil or plate is preferably closed along its seam edges with an adhesive tape or the like so as to avoid gaping at the seam edges. The foil or the plate consists preferably of a material which is essentially incompressible, for example of plastics or metal, in particular a ferromagnetic metal such as tin foil or the like, whereby the printing plate can later be used on magnetic cylinders.

The printing plate produced according to the method of the invention can be processed mechanically at its surface after its withdrawal from the surface area of the carrier. It is particularly advantageous if the printing form blank is already processed, in particular ground, to a cylindrical peripheral form, after the curing of the elastomer layer and before separating. By rotating the carrier and simultaneous engaging a rotating grinding wheel against the surface of the cured elastomer layer, a printing form blank with a highly accurate cylindrical surface is obtained which maintains its accuracy after the subsequent separation and which ensures an accurately smooth surface of the printing plate, which could not be obtained with the photopolymer plates of the past. By this processing of the surface of the elastomer layer, it is particularly possible to also obtain very thin printing plates having a thickness of 1 to 5 mm and a very even surface, which are preferably used for obtaining optimal printing qualities.

It is particularly advantageous if the adhesive tape or the like which closes the separating foil or the separating plate along their seam edges has a thickness corresponding to the thickness of the elastomer layer after its processing to the cylindrical peripheral form. The advantage of this is that, for the withdrawal of the printing form blank from the cylindrical carrier, this does not have to be cut along the seam edges with a special tool or the like, but that only the adhesive tape which connects the separating foil or the separating plate has to be pulled off so as to be able to withdraw the previously endless printing form blank as a printing plate, but which is already ground or twisted off.

The printing plate produced according to the method of the invention comprises essentially the same characteristics and advantages as the endless printing form according to DE 196 25 749, the description of which is expressly referred to. The cured elastomer layer of the printing plate can be engraved directly by means of a work laser by means of engraving, whereby the finished printing form can be produced particularly fast and in a cost-effective manner.

The printing plate produced according to the method of the invention can in a particularly advantageous manner be provided with a compressible underlayer at its rear side after its withdrawal from the surface area of the carrier. The arrangement of the compressible underlayer, which is particularly necessary with very thin printing plates for achieving a very good printing result takes place in any case, after the plate was processed mechanically at its upper side on a hard base, preferably on a steel cylinder, in particular ground or twisted off. The advantage of this is that the elastomer layer cannot evade at its rear side during the processing of its surface, whereby it is ensured that the plate has an even thickness over its entire area after the processing.

It is also possible, with the method according to the invention, to engrave the printing form after the processing of the printing form blank on the cylindrical peripheral form, but prior to the separation for forming the printing plate. After the withdrawal of the printing plate, which has already been prepared for printing, from the carrier, it can then be provided with the compressible underlayer at its rear side and can then be pulled onto a printing plate sleeve or a format cylinder for printing, whereby, by the engraving of the printing plate, which already took place in the cylinder form, it is not necessary to consider a distortion factor which accounts for the fact that printing plates which are manufactured in the plane and which are subsequently mounted onto cylinders, are expanded at their surface by a certain amount. The printing image is, with this particular strategy, compressed during the withdrawal of the printing plate from the cylindrical carrier, and the compressed image is then expanded to the same dimensions which were present during engraving, as long as the diameter of the cylindrical carrier and the diameter of the printing plate sleeve or the format cylinder used later are adjusted with regard to one another.

As has already been mentioned, the engraving of the printing plate can preferably take place by means of laser engraving whereby a work laser also used during engraving of the endless printing forms according to DE 196 25 749, provides that regions of the elastomer layer with a large area can also be removed in a comparatively short time.

With the invention, a printing plate for relief printing, in particular for flexoprinting, is created, which essentially consists of a lower carrier foil or plate and an elastomer layer of silicone polymer, silicone fluorine polymer or polyurethane applied thereto, which is processed, in particular ground, after its application to the carrier foil or carrier plate and curing, for forming an even surface. The elastomer layer preferably consists of cold curing silicone polymer or silicone fluorine polymer. The printing plate according to the invention can preferably be provided with a compressible layer at the rear side of its carrier foil or plate, as is advantageous and often required for so-called thin printing plates for producing a high printing quality. So as to achieve a layer thickness of the elastomer layer as even and as reproducible as possible, it can be applied to the carrier foil or plate in the form of adjacent, track-like material strands which flow into one another.

Figure 2:
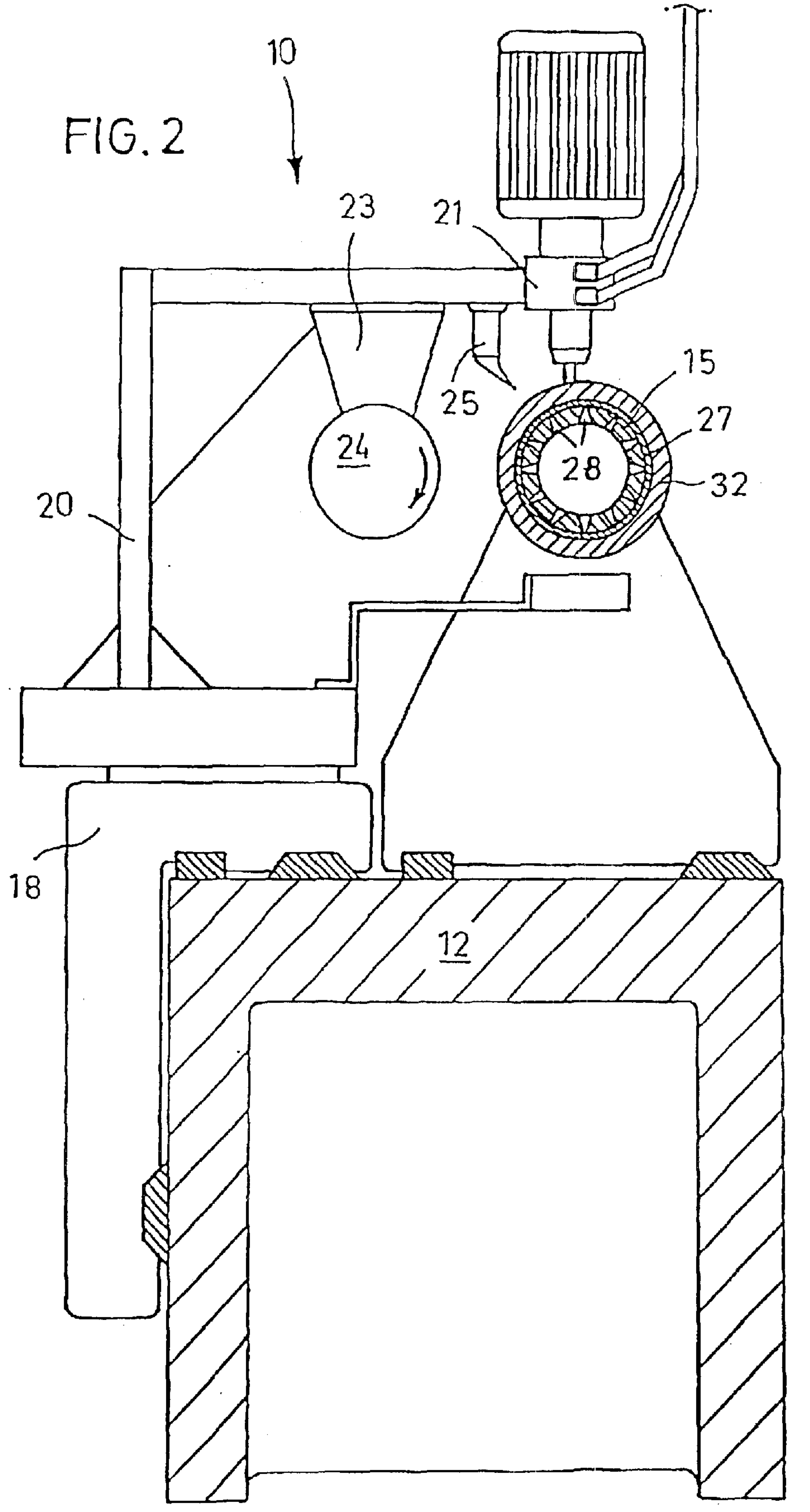
Figure 4:
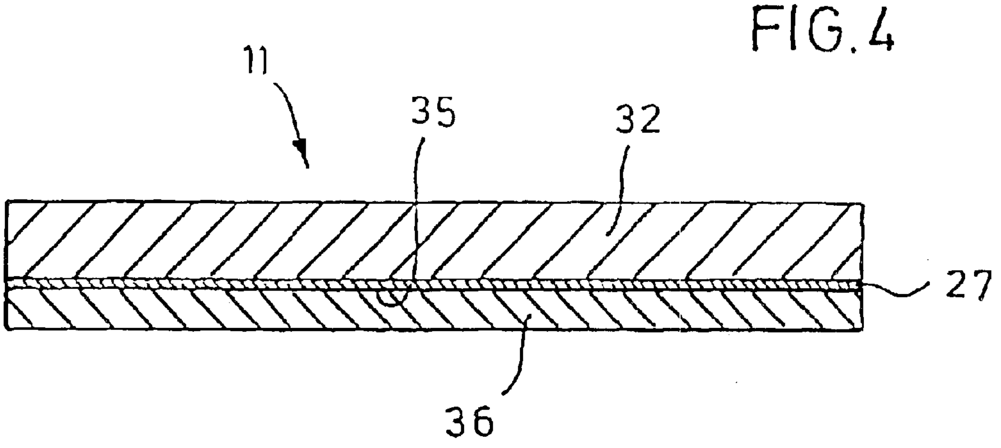
Figure 3:
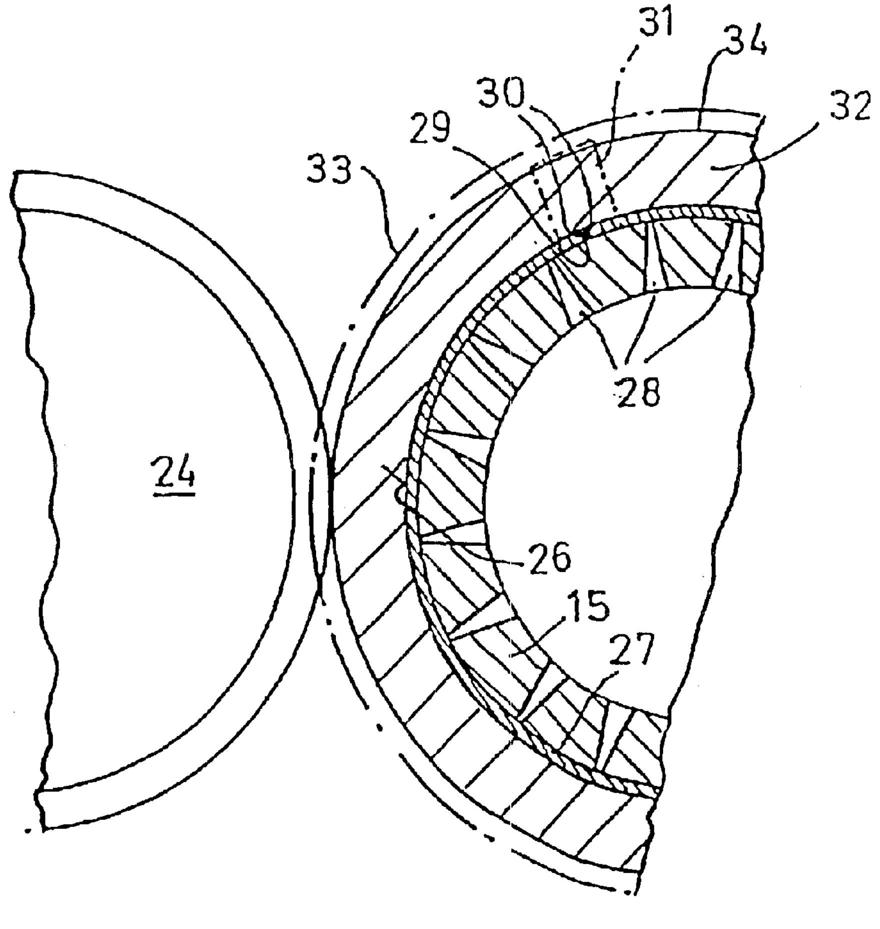

Further characteristics and advantages of the invention result from the following description and the drawing, wherein a preferred embodiment of the invention is explained in more detail with an example. It shows:

FIG. 1 a device for performing the method according to the invention for producing a printing plate according to the invention in a simplified front view;

FIG. 2 the object of FIG. 1 in a section along line II—II;

FIG. 3 the processing of the printing form blank at its periphery by means of a grinding device in a cut-out and FIG. 4 a section through a printing plate according to the invention.

The device 10 shown in FIGS. 1 and 2 serves for producing printing forms, in particular printing forms 11 according to the invention, but also for producing endless printing forms as described in the older patent application DE 197 56 327 A1, which is herein expressly referred to.

The device 10 consists essentially of a machine bed 12, a driven headstock 13 which is arranged at one end thereof and a tailstock 14 provided at the other end, between which a vacuum platen 15 is arranged, with its axle ends 16 in such a manner that it is rotated around its axis during the rotation of the spindle of the headstock, as is shown by the arrow 17.

A longitudinal slide 18 is mounted on the machine bed of the device 10, which slide can be moved from one end of the device at the tailstock to the other end at the headstock, and back, as is indicated by the double arrow 19. The longitudinal slide carries a mixing and dosing head 21 on one carrier arm 20, as well as a grinding device 23, which can be engaged transversely to the axis 22 of the platen 15, with a grinding wheel 24 which can be driven in a rotary manner and a cutting element 25, which can also engage the vacuum platen, the significance of which will be described in detail in the following.

As results in particular from FIGS. 2 and 3, a thin flexible but not expandable carrier foil 27 is arranged on the cylindrical surface area 26 of the vacuum platen 15 which engages the periphery of the vacuum platen without folds and which is held in a torque proof manner at is surface area by means of suction holes 28 of the vacuum platen. At the seam location 29 of the carrier foil 27 parallel to the axis of rotation of the vacuum platen 15, the seam edges 30 are connected to one another by a very thick adhesive band 31, as can be seen in FIG. 3.

With the help of the mixing and dosing head, an elastomer material 32, which is mixed from two components in the mixing head, is applied to the carrier foil 27 on the rotating platen 15 in the form of a material strand, which places itself helically on the periphery of the platen due to the superposition of the rotary movement of the platen and the longitudinal movement of the mixing head and thereby dissolves with the material which was placed during the respective previous rotation. The elastomer material is a two-component silicone polymer material which is cold curing in this preferred exemplified embodiment and which cures after application to the carrier foil 27 placed around the vacuum platen 15 and thereby forms an essentially cylindrical endless printing form blank, the radius of which is indicated in FIG. 3 at 33.

After the curing of the elastomer material to the printing form blank, the grinding device 23, which is also arranged on the carrier arm, is engaged in such a manner with the vacuum platen which was coated in the previous process step, that its grinding disc 24 processes the printing form blank 33 at its peripheral surface 34, when the vacuum platen and the grinding disc are driven in a rotating manner and the carrier arm 20 moves with the grinding arrangement arranged thereon in the longitudinal direction of the machine bed between the headstock 13 and the tailstock 14. The printing form blank obtains a very exact cylindrical peripheral form by means of this grinding. As the carrier foil 27 is pliable, but practically incompressible in the radial direction of the platen, the radial forces exerted on the printing form blank during the grinding of the grinding disc are optimally caught without resulting in undesired deformations or an evasion of the printing form blank radially inwardly.

After the grinding of the printing form blank 33 to the desired thickness of the elastomer layer, the largely finished printing form is taken off the vacuum platen 15. This can take place in that an axis-parallel cut is produced through the elastomer layer and the carrier foil 27 with the help of the cutting element 25 engaging the vacuum platen 15 by moving the carrier arm from one end of the device to the other end, while the drive for the headstock 13 is shut down, and the vacuum platen does not rotate. With the preferred exemplified embodiment, in which the printing form blank 33 was ground down by means of the grinding disc 25 to such an extent that the thick adhesive tape 31 is exposed during grinding, as is shown in FIG. 3, it is sufficient to simply peel off the adhesive tape 31 so as to expose a channel passing over the entire thickness of the elastomer layer above the joint 29, so that it is possible, after switching off the vacuum in the vacuum platen, to lift off the printing plate 11, which is not endless anymore, from the surface area 26 of the printing platen.

With the method described above, a printing plate is obtained having an extraordinarily high surface accuracy, as was up to now only known in endless printing forms. The printing plate can be engraved immediately after its withdrawal from the cylindrical platen, and in a preferable manner by direct engraving by means of a computer controlled laser which works out the regions from the surface of the printing plate which shall not print later. It is also possible to generate the engraving already in the printing plate before it is lifted off the surface area of the cylinder and laid out in an even position. This procedure, which can be useful if the printing plate is later pulled onto a printing plate sleeve or a format cylinder having the same diameter as the vacuum platen, has the advantage that during the execution of the engraving, no deformation has to be considered, which accounts for the plate expansion, that is the extension of the printing motif during the pulling of the even plate onto a cylindrical sleeve or a cylinder.

As can be seen from FIG. 4, the printing plate produced in accordance with the method described above, can be provided with a compressible layer 36 at the rear side 35 of its carrier foil, after it was taken off the surface area of the carrier 15 his compressible layer 36, after it was taken off the surface area of the carrier 15. This compressible coating provides, in particular with small printing plate strengths with a thickness of the ground elastomer layer of less than 2.5 mm, the desired compressibility of the entire printing plate with a given printing height. The coating 36 can consist of an elastic adhesive foil (tape), as is known per se for the securing of printing plates to printing plate sleeves or the like. As the elastic coating only takes place after the withdrawal of the printing plate from the surface area of the carrier cylinder 15 and as an elastic underlayer is not applied to this, before the carrier foil 27 and subsequently the elastomer layer are applied, it is ensured that a high accuracy is achieved by the processing of the elastomer layer at its periphery by the grinding.

Instead of the carrier foil 27, a thin carrier plate of tin foil can also be used, which is arranged on the vacuum cylinder 15 at its periphery and onto which the silicone polymer is then applied. The production of the printing plate with the ferromagnetic carrier plate corresponds to the production method of such with a carrier foil of plastics or the like. But the use of a ferromagnetic carrier sheet has the advantage that the printing plate produced according to the method of the invention can also be used on so-called magnetic cylinders, on which it is held firmly at the periphery for example for label printing with the help of permanent magnets.

With the method according to the invention, even those materials can be processed to (plane) printing plates which could only be used for the production of endless forms up to now. A particular advantage of the method is that the rotary casting method can be used for the production of plane printing plates which has proved to be particularly advantageous for the processing of silicone polymer and/or silicone fluorine polymer materials, as has been described in the older specifications 196 25 749 C2 or DE 197 56 327 A1 of the applicant. Therewith, the same material qualities can be achieved with plane printing plates as have been reserved for endless printing forms up to now, and it is possible to provide the printing plates which are produced according to the method of the invention with an arbitrarily compressible underlayer with which the desired compressibility can be adjusted accurately during the later printing.

What is claimed is:

1. A method for producing a printing plate in particular for relief printing, comprising:

a) applying a layer (32) of a curable elastomer onto a carrier (15) having a cylindrical surface area (26);

b) curing the elastomer layer on the carrier (15) into an essentially cylindrical, endless printing form blank (33);

c) separating the printing form blank (33) along a section line essentially parallel to the axial direction (22) of the carrier; and d) withdrawal of the printing plate (11), which is produced in such a manner, from the surface area (26) of the carrier (15).

2. The method according to claim 1, wherein one of a silicone polymer, a silicone fluorine polymer and a polyurethane polymer is used as the curing elastomer (32).

3. The method according to claim 1, wherein one of a cold curing silicone polymer and a silicone fluorine polymer is used as the curing elastomer (32).

4. The method according to claim 1, wherein the elastomer (32) is applied with a rotational casting method to the surface area (26) of the carrier (15).

5. The method according to claim 1, wherein the elastomer (32) is applied as a track-like material strand describing a helical line.

6. The method according to claim 1, wherein a separating layer (27) is applied to the cylindrical surface area (26) of the carrier (15) prior to the application of the elastomer (32).

7. The method according to claim 6, wherein the separating layer (27) comprises one of a flexible foil and a plate.

8. The method according to claim 7, wherein one of the foil (27) and the plate is placed around the carrier (15) while forming a seam line (29) and that the later section line runs along the seam line (29).

9. The method according to claim 7, wherein the carrier (15) comprises a vacuum cylinder (15) and that one of the foil (27) and the plate is held to the cylindrical surface area (26) by means of a vacuum.

10. The method according to claim 7, wherein one of the foil (27) and the plate is closed along its seam edges (30) to an endless separating layer by means of an adhesive tape (31).

11. The method according to claim 10, wherein the adhesive tape (31), which closes one of the separating foil (27) and the separating plate along their seam edges (30), has a thickness corresponding to at least the thickness of the elastomer layer (32) after its processing to the cylindrical peripheral form.

12. A The method according to claim 7, wherein one of the foil (27) and the plate comprises a material which is essentially incompressible.

13. The method according to claim 7, wherein one of the foil (27) and the plate comprises one of plastics and metal, in particular of ferromagnetic metal.

14. The method according to claim 1, wherein the printing form blank (33) is processed, in particular ground, into a cylindrical peripheral form after curing the elastomer layer (32) and before the separation.

15. The method according to claim 1, wherein the printing plate (11) is provided with a compressible bottom layer (36) at its rear side (35) after its withdrawal from the surface area (26) of the carrier (15).

16. The method according to claim 1, wherein the printing form (11) is engraved after the processing of the printing form blank (33) to the cylindrical peripheral form, but before the separation, for forming the printing plate (11).

17. The method according to claim 16, wherein the engraving of the printing plate (11) takes place by means of laser engraving.

* * * * *

UNITED STATES PATENT AND TRADEMARK OFFICE

CERTIFICATE OF CORRECTION

PATENT NO. : 6,866,985 B2 
DATED : March 15, 2005
INVENTOR(S) : Lorig et al.

It is certified that error appears in the above-identified patent and that said Letters Patent is hereby corrected as shown below:

Title page,
Insert Item:
-- [30] Foreign Application Priority Data
May 15, 2000 - DE 100 23 560.3 --.

Signed and Sealed this

Thirtieth Day of August, 2005

JON W. DUDAS
*Director of the United States Patent and Trademark Office*

UNITED STATES PATENT AND TRADEMARK OFFICE

CERTIFICATE OF CORRECTION

PATENT NO. : 6,866,985 B2 
APPLICATION NO. : 10/276536
DATED : March 15, 2005
INVENTOR(S) : Lorig et al.

It is certified that error appears in the above-identified patent and that said Letters Patent is hereby corrected as shown below:

At Item (73) on Title Page of the patent, the entry should read:

(73) Assignee: (1) Polywest Kunststofftechnik Saueressig & Partner GmbH & Co. KG
(2) Sonderhoff GmbH Signed and Sealed this Twelfth Day of December, 2006

JON W. DUDAS
*Director of the United States Patent and Trademark Office*